(12) United States Patent
Moscaluk

(10) Patent No.: US 7,495,977 B1
(45) Date of Patent: Feb. 24, 2009

(54) MEMORY SYSTEM HAVING HIGH-SPEED ROW BLOCK AND COLUMN REDUNDANCY

(75) Inventor: Gary Moscaluk, Colorado Springs, CO (US)

(73) Assignee: Cypress Semiconductor Corp., San Jose, CA (US)

( * ) Notice: Subject to any disclaimer, the term of this patent is extended or adjusted under 35 U.S.C. 154(b) by 96 days.

(21) Appl. No.: 11/731,605

(22) Filed: Mar. 29, 2007

Related U.S. Application Data (60) Provisional application No. 60/788,214, filed on Mar. 31, 2006.

(51) Int. Cl.
G11C 29/00 (2006.01)
(52) U.S. Cl. .................................. 365/200; 365/201
(58) Field of Classification Search .................. 365/200, 365/201
See application file for complete search history.

(56) References Cited

U.S. PATENT DOCUMENTS 5,224,073 A * 6/1993 Nakayama ............... 365/200
6,055,204 A * 4/2000 Bosshart ................ 365/230.06
6,275,406 B1 * 8/2001 Gibson et al. ............ 365/49.17
6,385,071 B1 * 5/2002 Chai et al. ................ 365/49.1

* cited by examiner

Primary Examiner—Anh Phung (57) ABSTRACT

A high-speed redundancy circuit having redundant rows/blocks for replacing defective rows, columns and blocks. For row redundancy, an off-pitch encoder in conjunction with row control circuitry is used to disable defective rows while enabling non-defective rows. An off-pitch fuse is blown to enable redundant rows for a particular sub-array. Therefore, the enabled redundant row replaces the disabled defective row. For column/block redundancy, an encoder is used where appropriate off-pitch fuses are blown to enable the appropriate redundant blocks. Unlike row redundancy, the defective columns/blocks are not disabled. Instead when redundant blocks are enabled, the column/block control unit detects whether to transfer data to/from the redundant block/columns or block/columns corresponding to the defective columns. As a result of using off-pitch fuses the die size is reduced. Moreover, speed improves because complex circuitry is no longer required to disable defective columns/blocks and because enabling/disabling of rows occurs during an equalization period.

21 Claims, 6 Drawing Sheets

MEMORY SYSTEM HAVING HIGH-SPEED ROW BLOCK AND COLUMN REDUNDANCY

RELATED APPLICATIONS

This application claims the benefit and priority to a provisional application Ser. No. 60/788,214, inventor Moscaluk, entitled "A MEMORY SYSTEM HAVING HIGH-SPEED ROW BLOCK AND COLUMN REDUNDANCY" that was filed on Mar. 31, 2006. The above-cited provisional application is incorporated herein in its entirety.

TECHNICAL FIELD

Embodiments of the present invention relate to the field of electronics. More particularly, embodiments of the present invention relate to a memory system with high-speed row, block and column redundancy for a memory cell.

BACKGROUND ART

With growing use of computers, a need to use more memory cells to store large amounts of data has increased. In general, memory cells have rows, columns and blocks that can store data. However, during manufacturing and fabrication, portions of a memory array may be found defective (e.g., row, column, block or any combination thereof). During wafer testing defective rows, columns or blocks are replaced with redundant rows, redundant columns and redundant blocks.

One method to remedy defective rows, columns and blocks is to replace them with a redundant row, a redundant column and a redundant block memory cells. This method uses on-pitch fuses to disable a defective row, a defective column and/or a defective block respectively. For example when a defective row is detected, the on-pitch fuse is blown in order to disable the defective row and row control circuitry is used to enable a redundant row to replace the defective row. Similarly when defective columns or when a defective block is detected, the on-pitch fuse for the block containing the defective columns is blown to disable the block containing the defective columns. Similarly, the on-pitch fuse for the defective block is blown to disable the defective block. When this defective block or block containing defective columns is disabled, block control circuitry enables a redundant block to replace the disabled block.

Figure 1:
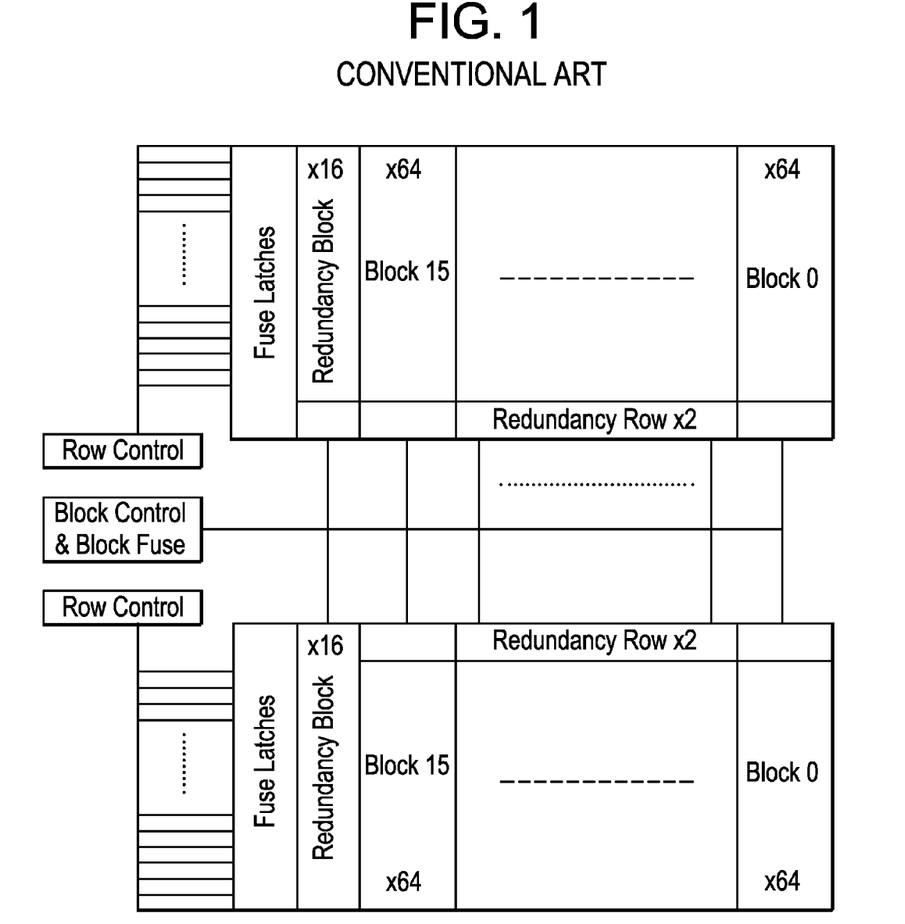
FIG. 1 shows a conventional art on-pitch fuse circuit for row, column and block control redundancy scheme.

The on-pitch fuse method for replacing defective rows, columns and/or blocks is shown in FIG. 1. Unfortunately this method adversely affects the size of the memory array since on-pitch fuses are physically placed for every row and in some cases for every block in the array. Placing the fuse in the array substantially increases the die size. Moreover, this method leads to a slower redundancy operation because it requires critical signals that control the redundant rows, columns and/or blocks to be generated through additional circuitry in the fuse latch, affecting the speed of the redundancy operation.

Another method for replacing defective rows, columns and/or blocks is to use off-pitch fuses in conjunction with control logic. Unfortunately, not only does this method require using complex control logic it also adversely impacts the speed for the redundancy array section.

SUMMARY

Accordingly, a need has arisen to perform a row, column and/or block redundancy operation or any combination thereof without using on-pitch fuses and without using complex control logic circuitry. It will become apparent to those skilled in the art in view of the detailed description of the present invention that the present invention remedies the above mentioned needs.

In one embodiment of the present invention for row redundancy, an off-pitch encoder is used to disable defective rows while enabling non-defective rows of a sub-array. Furthermore, an off-pitch fuse is blown to enable a redundant row for the sub-array. Therefore, the enabled redundant row replaces the disabled defective row. Similarly, in one embodiment of the present invention for column and block redundancy, an encoder is used. For column and block redundancy, appropriate off-pitch fuses are blown to enable the appropriate redundant blocks. Unlike row redundancy, neither defective columns nor defective blocks are disabled. Instead when a redundant block is enabled, the encoder in conjunction with control circuitry multiplexes input or output data to or from the redundant block instead of the block containing defective columns or instead of the defective block.

This method utilizes off-pitch fuses as well as off-pitch encoder, thereby reducing the die size. Moreover, this method has no speed loss due to the enabling/disabling operations. In fact, since this method does not require disabling defective columns or defective blocks, it significantly reduces the complexity of the encoder as well as improving its speed. The speed in row redundancy is improved because enabling and disabling rows may occur during an equalization period where the bit lines are pre-charged in preparation for the next cycle.

More specifically, an embodiment of the present invention pertains to a redundancy circuit comprising a memory circuit including a plurality of memory rows; a plurality of memory columns/blocks; a plurality of redundant memory rows coupled to the plurality of memory rows operable to replace defective memory rows of the plurality of memory rows; and a plurality of redundant memory columns/blocks coupled to the plurality of memory columns/blocks operable to replace defective memory columns/blocks of the plurality of memory columns/blocks; a first encoder coupled to the memory circuit, wherein the first encoder comprises at least one row redundancy off-pitch fuse, and wherein blowing at least one of the row redundancy off-pitch fuse is operable to enable at least one of the plurality of redundant memory rows operable to replace defective memory rows; a row control unit coupled to the first encoder, wherein the row control unit in response to the blowing said row redundancy off-pitch fuse is operable to disable defective memory rows of the plurality of memory rows, and further operable to enable non-defective memory rows of the plurality of memory rows; a second encoder coupled to the plurality of redundant memory columns/blocks, wherein the second encoder comprises at least one column/block redundancy off-pitch fuse, and wherein blowing the column/block redundancy off-pitch fuse is operable to enable at least one of the plurality of redundant memory columns/blocks; and a column/block control unit coupled to the second encoder, wherein the column/block control unit is operable to determine defective memory columns/blocks, and in response to the determining utilizing the enabled redundant memory columns/blocks during data transfer, wherein the utilizing is operable to replace the defective memory columns/blocks.

According to one embodiment, the number of off-pitch fuses for the plurality of redundant memory rows is less than or equal to the number of the plurality of memory rows. Similarly, in one embodiment, the number of the off-pitch fuses for the plurality of redundant memory columns/blocks is less than or equal to the number of the plurality of memory columns/blocks.

According to one embodiment, the row control unit comprises a combinational logic unit. Moreover, in one embodiment, the column/block control unit may be a multiplexer. In one embodiment, the redundancy operation may occur during equalization period. It is appreciated that the control units may be programmable (e.g., FPGA).

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

Reference will now be made in detail to embodiments of the present invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be evident to one of ordinary skill in the art that the present invention may be practiced without these specific details. In other instances, well known methods, procedures, components, and circuits have not been described in detail as not to unnecessarily obscure aspects of the invention.

NOTATION AND NOMENCLATURE

Some portions of the detailed descriptions which follow are presented in terms of procedures, steps, logic blocks, processing, and other symbolic representations of operations on data bits that can be performed on computer memory. These descriptions and representations are the means used by those skilled in the art to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities.

Usually, though not necessarily, these quantities take the form of electrical or magnetic signals capable of being stored, transferred, combined, compared, and otherwise manipulated in a computer system. It has proven convenient at times principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from following discussions, it is appreciated that throughout the present invention, discussions utilizing terms such as "processing" or "creating" or "transferring" or "executing" or "determining" or "instructing" or "issuing" or "halting" or "clearing" or "accessing" or "aggregating" or "obtaining" or "selecting" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

A Memory System Having High-Speed Row Block and Column Redundancy

One embodiment of the present invention takes advantage of off-pitch fuses in order to enable redundant rows, columns, blocks or any combination thereof. Using off-pitch fuse reduces the die size.

Moreover, according to one embodiment of the present invention, neither defective columns nor defective blocks are disabled. Since, the need to disable defective columns and defective blocks is eliminated, the complex circuitry used to disable defective columns and defective blocks is also eliminated. Instead, an encoder and a multiplexer may be used to determine defective columns and defective blocks, thereby transferring data to/from the redundant block instead of transferring data to/from either defective columns or defective blocks. As a result, the speed for redundant operation is improved.

For the row redundancy operation scheme, defective rows are disabled using an encoder instead of blowing their respective fuses. According to one embodiment of the present invention, the row redundancy operation scheme enables the redundant row by blowing its fuse. Using off-pitch fuses as well as using an off-pitch encoder reduces the die size substantially.

Figure 2:
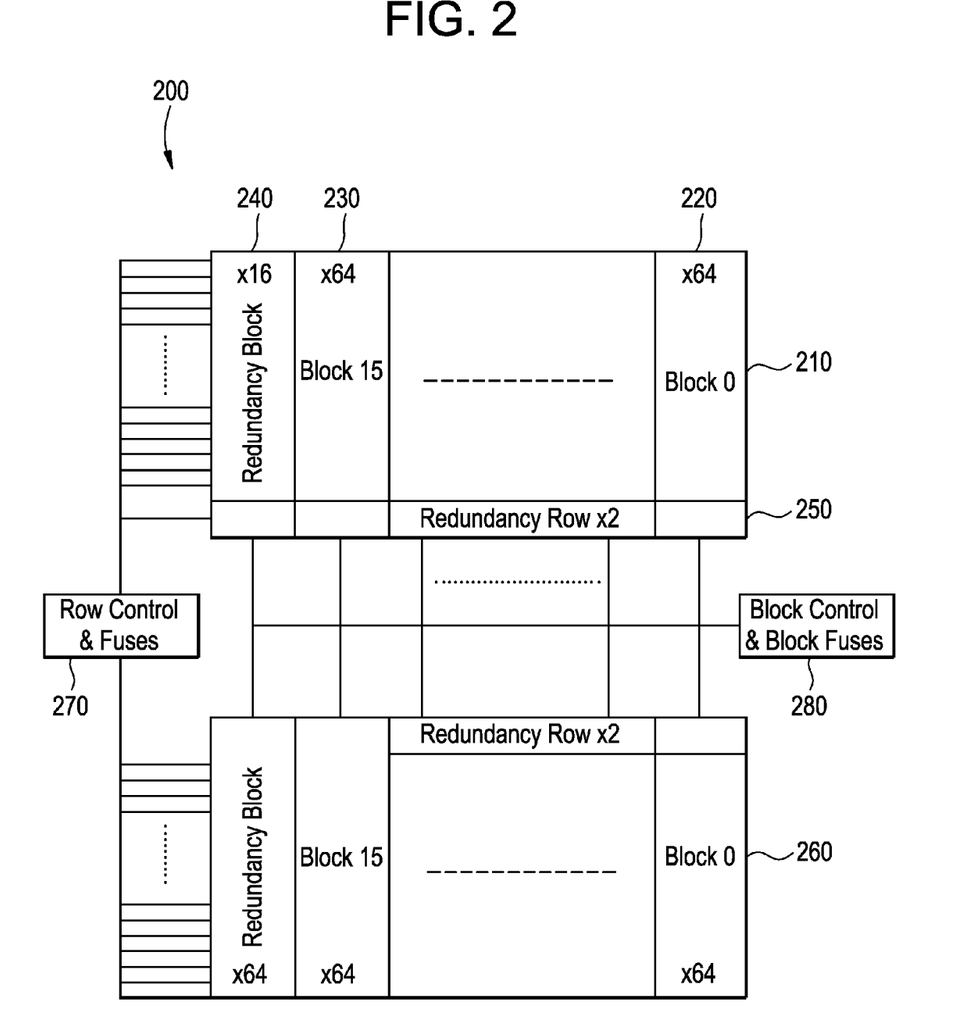
FIG. 2 shows an off-pitch fuse circuit for row, column and block control redundancy in accordance with one embodiment of the present invention.

Referring now to FIG. 2, off-pitch fuse circuitry for row, column and block control redundancy in accordance with one embodiment of the present invention is shown. A memory array 200 comprising two sub-arrays, a north sub-array 210 and a south sub-array 260, is shown. It is appreciated that any number of arrays may be used and the two sub-arrays shown here are exemplary and should not be construed as limiting the scope of the present invention.

Each sub-array circuit may comprise of a plurality of columns and rows (not shown) and a plurality of blocks (e.g., Block 220 and Block 230). In this embodiment, each block may include 64 columns. In this example, one redundant block 240 with 16 columns and one redundant row section 250 with two redundant rows are shown. However, it is appreciated that the number of columns in a block, the number of redundant rows, the number of redundant blocks and the number of columns that redundant blocks contain may vary from one case to another based on design criteria. During wafer testing, a number of different rows, columns, blocks or any combination thereof may be found defective. As a result, redundant rows, redundant columns, redundant blocks or any combination thereof are usually supplied to replace the corresponding defective rows, columns, blocks and/or any combination thereof.

In the preferred embodiment of the present invention, row control circuitry and fuses 270 and a block/column control and block fuse 280 are used. It is appreciated that even though row control circuitry and fuses 270 and block/column control and block fuse 280 are shown as separate units, they may be integrated as a single unit. It is therefore appreciated that showing the two units as separate units should not be construed as limiting the scope of the present invention. Row control circuitry and fuses unit 270 are used for row redundancy operation and a block/column control and block fuses unit 280 are used for column and block redundancy operation.

Figure 3:
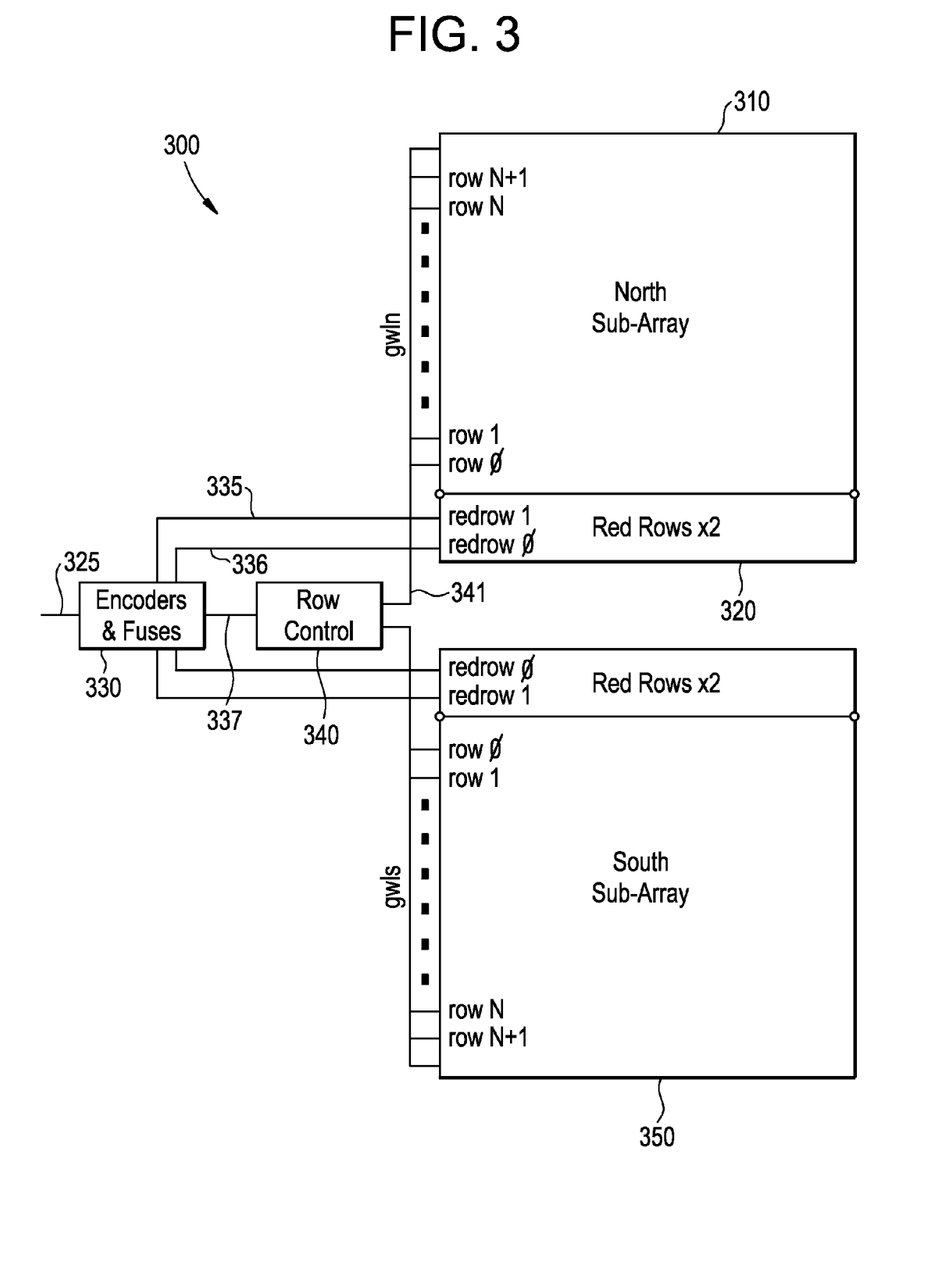
FIG. 3 shows an off-pitch fuse circuit for row control redundancy in accordance with one embodiment of the present invention.

Referring now to FIG. 3, an off-pitch fuse circuit for row control redundancy operation in accordance with one embodiment of the present invention is shown. Components for the row redundancy scheme are introduced and described in conjunction with the flow diagram of FIG. 4.

Referring still to FIG. 3, a memory array 300 comprising two sub-arrays, a north sub-array 310 and a south sub-array 350, is shown. The north sub-array includes a plurality of rows (e.g., Row 0 to Row N+1). Similarly, the north sub-array 310 includes a number of redundant rows 320 (e.g., redrow 0 and redrow 1). It is appreciated that even though only two redundant rows are shown, the memory cell may have less than two redundant rows or more than two redundant rows depending on the design criteria for a specific application. As such, the number of redundant rows should not be construed as limiting the scope of the present invention.

In one embodiment, encoders and fuses 330 are coupled to redundant rows 320 while row control 340 is coupled to the plurality of rows (e.g., Row 0 to Row N+1). It is appreciated that even though encoders and fuses 330 and row control 340 are shown as two separate units, they may be integrated into one working unit. As such, it is appreciated that showing the two units as separate units should not be construed as limiting the scope of the present invention. It is also appreciated that the row control block 340 may contain a combinational logic which enables and disables the plurality of rows (e.g., Row 0 to Row N+1) from one cycle to the next. It is further appreciated that the row control block 340 may be a programmable control unit (e.g., FPGA). The functionality of row redundancy operation is described in conjunction with FIG. 4.

Figure 4:
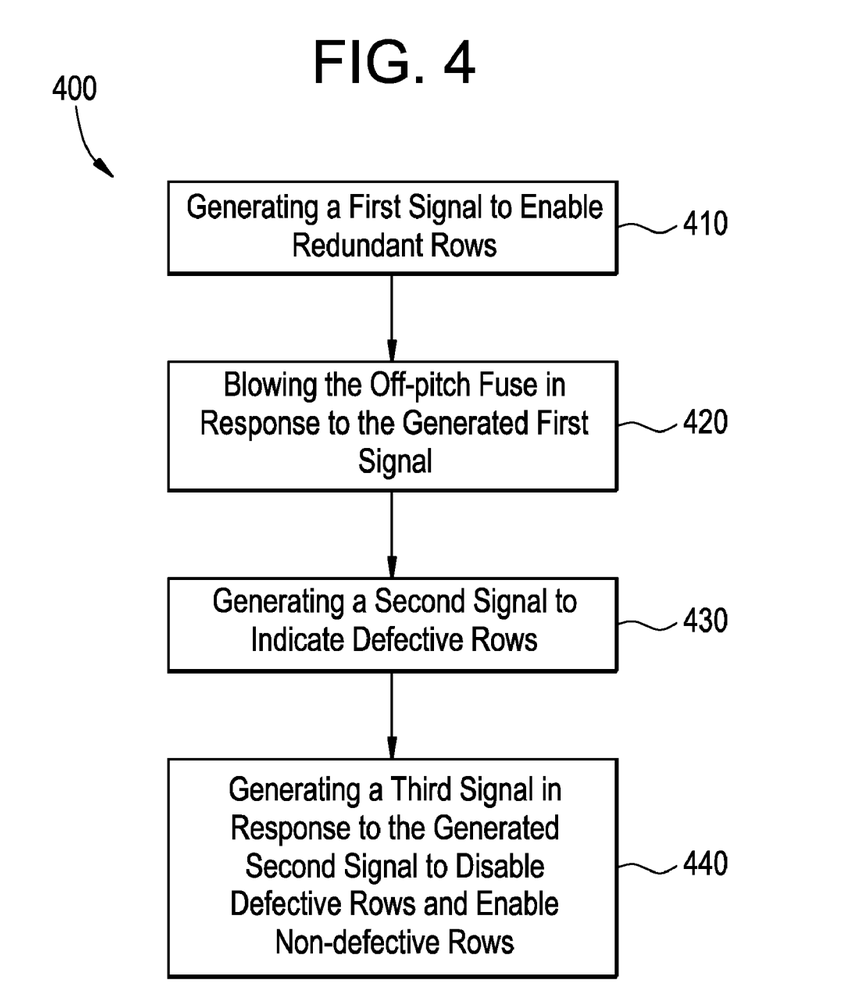
FIG. 4 shows a flow diagram of an off-pitch fuse circuit operation for row control redundancy in accordance with one embodiment of the present invention.

Referring now to FIG. 4, a flow diagram 400 for performing row redundancy operation in accordance with one embodiment of the present invention is shown. At step 410, a first signal 325 is generated indicating that a defective row exists in order to enable a redundant row. For example, the encoders and fuses 330 may receive the signal 325 indicating that one or more defective rows exist.

At step 420, in response to signal 325, encoders and fuses 330 blow respective off-pitch fuses in order to enable the appropriate redundant row in redundant rows 320 by sending signals 335 and 336 to the redundant rows 320. For example, if only one defective row exists, then one off-pitch fuse corresponding to one redundant row may be blown (e.g., off-pitch fuse for redrow 0) and its corresponding signal (e.g., signal 336) may be sent to the redundancy row 320 enabling the redundant row (e.g., redrow 0). Similarly, if two defective rows exist, two off-pitch fuses corresponding to the two redundant rows may be blown (e.g., off-pitch fuses for redrow 0 and redrow 1) and their corresponding signals (e.g., signal 335 and 336) may be sent to the redundancy row 320 to enable the redundant rows.

At step 430, a second signal (e.g., signal 337) may be generated by the encoder and fuses 330. The second signal (e.g., signal 337) may indicate which rows are defective. At step 440, based on signal 337, the row control unit 340 generates and sends a third signal (e.g., global word line 341). Global word line 341 controls all of the rows by enabling or disabling them depending on whether a row is defective.

It is appreciated that in order to prevent loss of speed in redundancy operation, all or portion of the enabling and disabling operations occurs during an equalization period. The equalization period is the section in time of a memory access cycle for an asynchronous part where the bit lines are precharged in preparation for the next cycle. It is also appreciated that the structure and functionality of the north sub-array as described may be applied to other sub-arrays (e.g., south sub-array 350). As such, the global word line 341 may disable a defective row (e.g., row N) while enabling non-defective rows (e.g., row 0 to row N−1 and row N+1).

As a result, redundant rows replace defective rows. Furthermore, using the redundant row operation scheme in accordance with one embodiment of the present invention, off-pitch fuses are utilized to enable redundant rows, thereby eliminating the need to disable defective rows by blowing on-pitch fuses. Additionally, since off-pitch fuses are used, the die size is reduced. Moreover, using the redundant row operation scheme in accordance with one embodiment of the present invention reduces the number of fuses used because fuses are used for redundant rows instead of using a fuse for every row of a memory cell.

Figure 5:
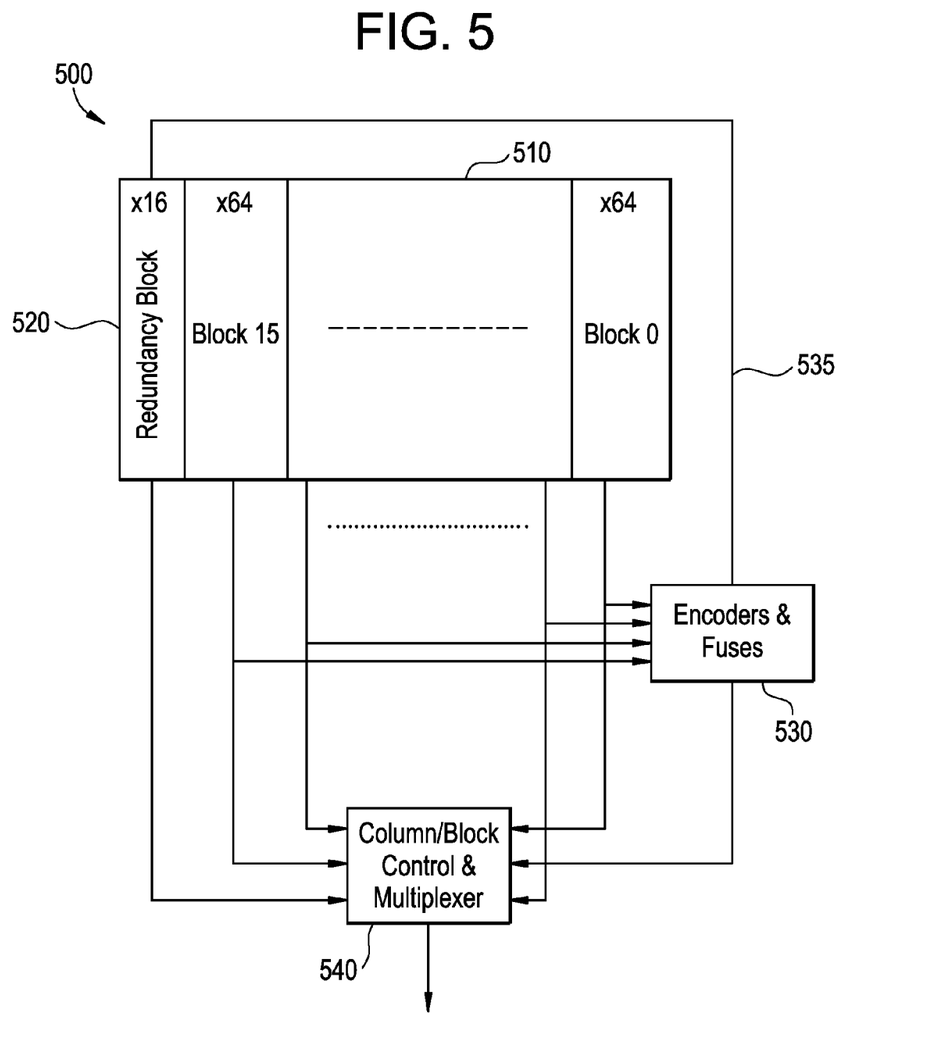
FIG. 5 shows an off-pitch fuse circuit for column and block control redundancy scheme in accordance with one embodiment of the present invention.

Referring now to FIG. 5, an off-pitch fuse circuit for column/block control redundancy operation in accordance with one embodiment of the present invention is shown. Components of a column/block redundancy scheme are introduced and described in conjunction with the flow diagram of FIG. 6.

Referring still to FIG. 5, a memory array 510 is shown comprising a plurality of blocks (e.g., Block 0 to Block 15) which may comprise columns (not shown). In this example, each memory block (e.g., Block 0) contains 64 columns. It is appreciated that a different number of columns may be used in other embodiments. The memory array 510 further comprises a redundant block 520. It is appreciated that even though only one redundant block is shown, the memory array may have more than one redundant block. Furthermore, in this example the redundancy block 520 contains 16 columns. It is appreciated that a different number of columns may be used in other embodiments. As such, the number of columns in the block and the number of redundant blocks should not be construed as limiting the scope of the present invention.

Encoders and fuses 530 are coupled to the redundant block 520 and to the memory array 510 (e.g., Block 0 to Block 15). Moreover, the encoders and fuses 530 are coupled to the column/block control and multiplexer 540, which are further coupled to the memory array 510 and the redundant block 520. It is appreciated that the multiplexer 540 may be a programmable unit (e.g., FPGA).

It is appreciated that even though encoders and fuses 530 and column/block control and multiplexer 540 are shown as two separate units, they may be integrated into one working unit. As such, it is appreciated that the two separate units as shown should not be construed as limiting the scope of the present invention. It is also appreciated that the column/block control 540 according to one embodiment may be a combinational logic. It is also appreciated that the column/block control 540 may be a programmable control unit (e.g., FPGA). The functionality of each component is described in conjunction with FIG. 6.

Figure 6:
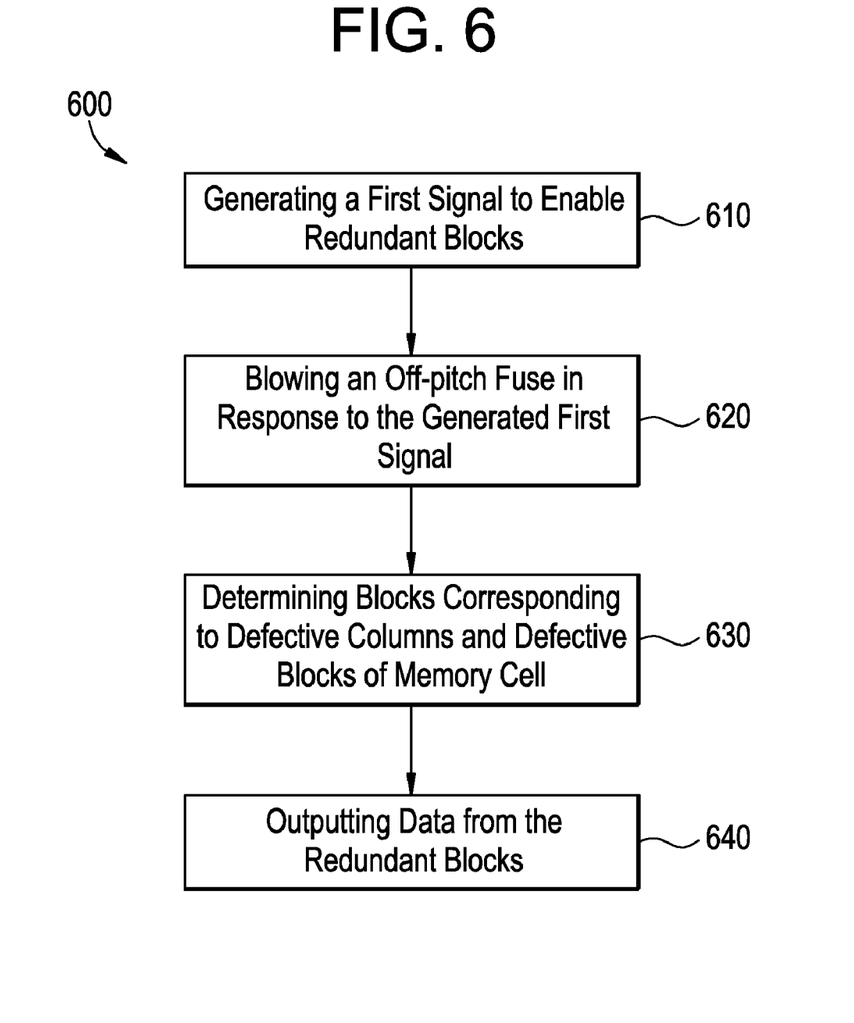
FIG. 6 shows a flow diagram of an off-pitch fuse circuit operation for column and block control redundancy in accordance with one embodiment of the present invention.

Referring now to FIG. 6, a flow diagram 600 for performing column/block redundancy operation in accordance with one embodiment of the present invention is shown. At step 610, the encoders and fuses 530 receive inputs from the memory array 510 (e.g., Block 0 to Block 15). When a column (not shown) or a block (e.g., Block 0 to Block 15) in the memory array 510 is found to be defective, the encoder generates a first signal (not shown) in order to enable the redundant block 520. At step 620, in response to the signal generated, an off-pitch fuse is blown sending a signal 535 to the redundant block 520, thereby enabling the redundant block 520.

The column/block control and multiplexer 540 receives data from memory array 510 (e.g., Block 0 to Block 15) as well as receiving data from the redundant block 520. Moreover, the column/block control and multiplexer 540 receives a signal from the encoder and fuses unit 530. At step 630, the column/block control and multiplexer 540 determines whether to transfer data to/from the redundant block or blocks corresponding to the defective columns. Furthermore, the column/block control and multiplexer may determine which columns of the redundant block will replace the defective columns of the defective block (e.g., Block 0 to Block 15).

At step 640, after determining whether data should be transferred to/from the redundant block or columns, the column/block control and multiplexer 540 transfers data to/from the redundant block 520 instead of transferring data to/from the block corresponding to defective columns, defective blocks or any combination thereof. As a result, defective columns or defective blocks or a block containing at least one defective column or any combination thereof are not disabled. Instead the column/block control and multiplexer 540 transfers data to/from the redundant block 520 instead of the block corresponding to defective columns or defective blocks. Therefore, redundant block 520 and defective columns, defective blocks or any combination thereof are enabled at the same time. However, the multiplexer 540 may be used to determine the blocks of data to be used. In one embodiment, the multiplexer 540 may determine the non-defective blocks/columns along with redundant blocks to be used for transferring data.

It is appreciated that in order to prevent loss of speed in redundancy operation, all or portion of the enabling operations may occur during an equalization period. The equalization period is the section in time of a memory access cycle for an asynchronous part where the bit lines are pre-charged in preparation for the next cycle.

As a result, redundant blocks replace defective columns/blocks. Furthermore, using the redundant column/block operation scheme according to one embodiment of the present invention comprises off-pitch fuses to enable redundant blocks without disabling defective columns/blocks. Therefore, using the redundant block operation scheme of the present invention avoids speed loss because complex circuitry to disable defective columns/blocks is no longer needed. Additionally, since off-pitch fuses are used, the die size is reduced. Moreover, using the redundant column/block operation scheme in accordance with one embodiment of the present invention reduces the number of fuses used because the technique for using a fuse for every block or column is no longer required.

In the foregoing specification, embodiments of the invention have been described with reference to numerous specific details that may vary from implementation to implementation. Thus, the sole and exclusive indicator of what is, and is intended by the applicants to be, the invention is the set of claims that issue from this application, in the specific form in which such claims issue, including any subsequent correction. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. A row redundancy circuit comprising:
   a memory circuit comprising:
      a plurality of memory rows; and
      a plurality of redundant memory rows coupled to said plurality of memory rows operable to replace defective memory rows of said plurality of memory rows;
   an encoder coupled to said memory circuit, wherein said encoder comprises at least one off-pitch fuse, and wherein blowing said at least one off-pitch fuse is operable to enable at least one of said plurality of redundant memory rows operable to replace defective memory rows; and
   a row control unit coupled to said encoder, wherein said row control unit in response to said blowing said off-pitch fuse is operable to disable defective memory rows of said plurality of memory rows, and further operable to enable non-defective memory rows of said plurality of memory rows.

2. The row redundancy circuit as described in claim 1, wherein said row control unit comprises a combinational logic unit.

3. The row redundancy circuit as described in claim 1, wherein said encoder and said row control units are integrated within a single unit.

4. The row redundancy circuit as described in claim 1, wherein a number of said off-pitch fuses are less than or equal to the number of said plurality of memory rows.

5. The row redundancy circuit as described in claim 1 further comprising more than one encoder.

6. The row redundancy circuit as described in claim 1 further comprising more than one row control unit.

7. The row redundancy circuit as described in claim 1, wherein said redundancy operation occurs during equalization period.

8. A column/block redundancy circuit comprising:
   a memory circuit comprising:
      a plurality of memory columns/blocks; and
      a plurality of redundant memory columns/blocks coupled to said plurality of memory columns/blocks operable to replace defective memory columns/blocks of said plurality of memory columns/blocks;
   an encoder coupled to said plurality of redundant memory columns/blocks, wherein said encoder comprises at least one off-pitch fuse, and wherein blowing said off-pitch fuse is operable to enable at least one of said plurality of redundant memory columns/blocks; and
   a column/block control unit coupled to said encoder and operable to determine defective memory columns/blocks, and in response to said determining utilizing said enabled redundant memory columns/blocks during data transfer, wherein said utilizing is operable to replace said defective memory columns/blocks.

9. The column/block redundancy circuit as described in claim 8, wherein said column/block control unit is a multiplexer.

10. The column/block redundancy circuit as described in claim 8, wherein said encoder and said column/block control unit are integrated within a single unit.

11. The column/block redundancy circuit as described in claim 8, wherein number of said off-pitch fuses are less than or equal to the number of said plurality of redundant memory columns/blocks.

12. The column/block redundancy circuit as described in claim 8 further comprising more than one encoder.

13. The column/block redundancy circuit as described in claim 8 further comprising more than one column/block control unit.

14. The column/block redundancy circuit as described in claim 8, wherein said column/block redundancy operation occurs during equalization period.

15. A redundancy circuit comprising:
  a memory circuit comprising:
    a plurality of memory rows;
    a plurality of memory columns/blocks;
    a plurality of redundant memory rows coupled to said plurality of memory rows operable to replace defective memory rows of said plurality of memory rows; and
    a plurality of redundant memory columns/blocks coupled to said plurality of memory columns/blocks operable to replace defective memory columns/blocks of said plurality of memory columns/blocks;
  a first encoder coupled to said memory circuit and comprising at least one row redundancy off-pitch fuse, and wherein blowing at least one of said row redundancy off-pitch fuse is operable to enable at least one of said plurality of redundant memory rows operable to replace defective memory rows;
  a row control unit coupled to said first encoder, wherein said row control unit in response to said blowing said row redundancy off-pitch fuse is operable to disable defective memory rows of said plurality of memory rows, and further operable to enable non-defective memory rows of said plurality of memory rows;
  a second encoder coupled to said plurality of redundant memory columns/blocks and comprising at least one column/block redundancy off-pitch fuse, and wherein blowing said column/block redundancy off-pitch fuse is operable to enable at least one of said plurality of redundant memory columns/blocks; and
  a column/block control unit coupled to said second encoder and is operable to determine defective memory columns/blocks, and in response to said determining utilizing said enabled redundant memory columns/blocks during data transfer, wherein said utilizing is operable to replace said defective memory columns/blocks.

16. The redundancy circuit as described in claim 15, wherein a number of said off-pitch fuses for said plurality of redundant memory rows is less than or equal to the number of said plurality of memory rows.

17. The redundancy circuit as described in claim 15, wherein a number of said off-pitch fuses for said plurality of redundant memory columns/blocks is less than or equal to the number of said plurality of memory columns/blocks.

18. The redundancy circuit as described in claim 15, wherein said row control unit comprises a combinational logic unit.

19. The redundancy circuit as described in claim 15, wherein said column/block control unit is a multiplexer.

20. The redundancy circuit as described in claim 15, wherein said redundancy operation occurs during equalization period.

21. The redundancy circuit as described in claim 15, wherein said control units are programmable control units.

* * * * *